United States Patent [19]
Love et al.

[11] Patent Number: 5,363,412
[45] Date of Patent: Nov. 8, 1994

[54] METHOD AND APPARATUS OF ADAPTIVE MAXIMUM LIKELIHOOD SEQUENCE ESTIMATION USING FILTERED CORRELATION SYNCHRONIZATION

[75] Inventors: Robert T. Love, Hoffman Estates; Gerald P. Labedz, Chicago; Kevin L. Baum, Hoffman Estates, all of Ill.

[73] Assignee: Motorola, Inc., Schaumburg, Ill.

[21] Appl. No.: 998,063

[22] Filed: Dec. 28, 1992

[51] Int. Cl.[5] ............... H04L 27/06; H03M 13/12
[52] U.S. Cl. ................................. 375/94; 375/96; 375/103; 371/43
[58] Field of Search ............... 375/34, 39, 94, 96, 375/100, 103; 371/43; 329/304

[56] References Cited

U.S. PATENT DOCUMENTS

| | | | |
|---|---|---|---|
| 4,484,338 | 11/1984 | Clark et al. | 375/94 |
| 4,885,757 | 12/1989 | Provence | 375/96 |
| 5,127,025 | 6/1992 | Oanoue | 375/100 |
| 5,202,903 | 4/1993 | Okanoue | 375/94 |

FOREIGN PATENT DOCUMENTS

0425458A1  5/1991  European Pat. Off. .

OTHER PUBLICATIONS

Adaptive Maximum Likelihood Sequence Estimation for Digital Signalling in this Presence of Intersymbol Interference, by F. R. Magee and J. G. Proakis, IEEE Transactions on Information Theory, Jan. 1973.

*Primary Examiner*—Stephen Chin
*Assistant Examiner*—Young Tse
*Attorney, Agent, or Firm*—Anthony G. Sitko

[57] ABSTRACT

A method and apparatus are provided for maximum likelihood sequence estimation. The method and apparatus includes a first maximum likelihood sequence estimator signal path for flat fading and an at least second maximum likelihood sequence estimator signal path for other than flat fading. The method and apparatus for further includes selecting the signal path with a least relative magnitude mean square error.

20 Claims, 3 Drawing Sheets

METHOD AND APPARATUS OF ADAPTIVE MAXIMUM LIKELIHOOD SEQUENCE ESTIMATION USING FILTERED CORRELATION SYNCHRONIZATION

FIELD OF THE INVENTION

The field of the invention relates to decoding of radio signals and, in particular, to maximum likelihood sequence estimation.

BACKGROUND OF THE INVENTION

The effects of a radio channel upon a radio signal transmitted on the radio channel are well known. Well-known effects include poor signal quality due to low signal to noise ratio (SNR), adjacent and co-channel interference and multi-path propagation. Where extreme distance is a factor a poor SNR may be due to thermal noise. Where distance is slight a poor SNR may be due to competing signals on the same or an adjacent channel.

Multi-path propagation, on the other hand, produces an effect on the signal characterized by multiple copies of the signal being presented to a receiver at slightly different times and with slightly different phases. In extreme cases multiple copies of a signal may arrive at a receiver offset over a time interval comparable to a symbol transmission rate.

The problem of multi-path propagation results in a summation of signals being presented to a receiver that may bear little resemblance to the originally transmitted signal. Where either the transmitter or receiver is moving (e.g., a radiotelephone in an automobile) the problem of multi-path propagation may be further aggravated in that the effects on the signal may also vary with physical location.

Past efforts to improve decoding of signals subject to low SNR and the effects of multi-path propagation have included adding a training (synchronization) sequence to the beginning of data transmission within a frame of information and cross-correlating the received signal against the known training sequence. The results of the cross-correlation are then used to characterize and compensate for the affects of the transmission channel.

While characterizing the transmission channel is effective for short periods, such characterization may not be effective for frames having durations of several milliseconds. For frames of longer duration the transmitter and receiver may change physical locations thereby changing the transmission channel and altering transmission characteristics.

Past efforts to improve performance under such conditions have included the systems discussed in IEEE Transactions On Information Theory, January 1973, pgs. 120–124, F. R. Magee Jr. and J. G. Proakis: "Adaptive Maximum Likelihood Sequence Estimation for Digital Signaling in the Presence of Intersymbol Interference". The Magee and Proakis article teaches of a system having an adaptive filter used in conjunction with a viterbi decoder. The values of the adaptive filter are determined upon detection of a training sequence and subsequently modified based upon each new symbol output from the viterbi decoder.

While the Magee and Proakis system has been effective, the effectiveness of the adaptive filter is dependent upon detection and timing of the training sequence. Where the training sequence is corrupted or subject to superposition of multiple copies of the training sequence then the effectiveness of the adaptive filter declines because of synchronization deficiencies and dispersion of signal energy. Because of the importance of maximum likelihood sequence estimators a need exists for a better method of synchronization with, and optimization of signal energy within the training sequence.

SUMMARY OF THE INVENTION

A method and means is provided for maximum likelihood sequence estimation. The method and means for includes a first maximum likelihood sequence estimator signal path for flat fading and an at least second maximum likelihood sequence estimator signal path for other than flat fading. The method and means further includes selecting the signal path with a least relative magnitude mean square error.

DETAILED DESCRIPTION OF THE PREFERRED EMBODIMENT

The solution to the problem of synchronization of maximum likelihood sequence estimators lies, conceptually, in the use of filtered correlation synchronization. Filtered correlation synchronization provides a method of optimizing timing of decoding of a channel over a variety of time-delayed signal conditions.

Figure 8:
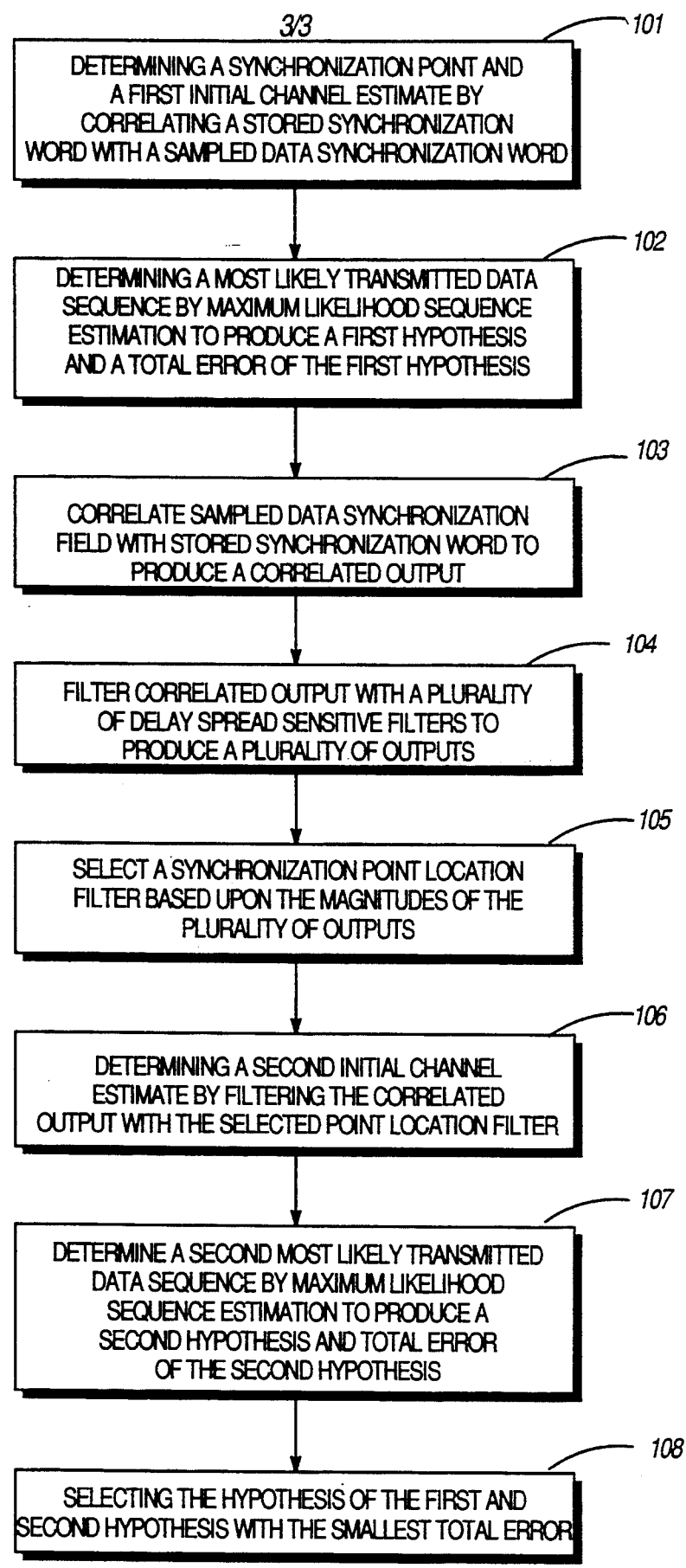
FIG. 8 is a flowchart illustrating the method of adaptive maximum likelihood sequence estimation according to a preferred embodiment of the present invention.

FIG. 8 illustrates the method of adaptive maximum likelihood sequence estimation according to a preferred embodiment of the present invention. Reference may be had to FIG. 8 throughout the following detailed description of the preferred embodiments.

The overall communications channel can be viewed as a convolutional encoder that convolves the information data with a set of time varying channel coefficients ($h_i$). The channel can therefore be viewed as imposing a fixed pattern (in the short term) on the transmitted data. The resultant signal pattern is further corrupted by additive white Gaussian noise. The decoder must determine which data sequence, when convolved with the channel coefficients, produces a pattern which is most likely to be close to the received pattern. If the transmitted data consists of N symbols then there are $M^N$ possible data sequences, with each considered equally likely (M is a number of possible symbols in a constellation of symbols).

Given that the constellation of possible data sequences (a(i)) include values from $i = 1, \ldots, K = M^N$, a maximum likelihood sequence estimator (MLSE) chooses a sequence a(m) as the most likely if the expression, P(r|a(m))>P(r|a(i)), is true for the chosen sequence (a(m)) over all other possible sequences. Such a determination is based upon a minimal total error of the chosen sequence over all other sequences (minimal Euclidean distance through a viterbi trellis).

Figure 1:
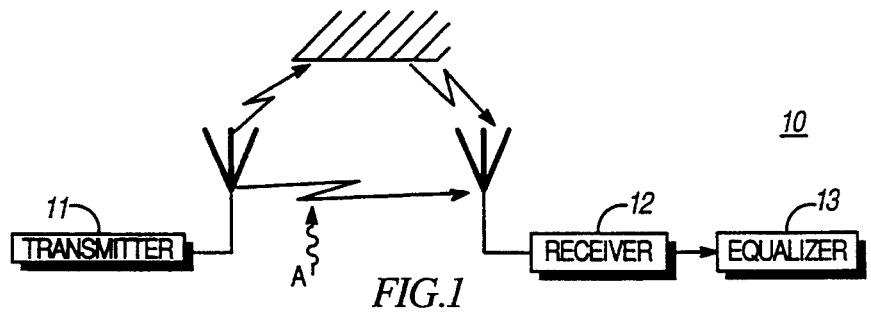
FIG. 1 comprises a communication system in accordance with the invention.

FIG. 1 is a block diagram of a radio transmission system (10). A transmitter (11) generates digital symbols s(n) from digital data and transmits such symbols for the benefit of a receiver (12). The signal received at the receiver (12) is filtered and sampled to produce a received digital signal y(j) which is sent to a channel equalizer (13). The equalizer (13) delivers, with a certain time delay, estimated signals s(j-L), which constitute an estimation of the transmitted signals s(n). (The designation (j) denotes a sampling timepoint and the designation (j-L) indicates that the estimated symbols are delayed by L sampling intervals.

The double signal paths shown in FIG. 1 indicate that the channel between the transmitter (11) and receiver (12) introduces a time dispersion into the signal received at the receiver (12). Shown in FIG. 1 is a signal "A" which indicates a disturbance signal on the same channel as that used between transmitter (11) and receiver (12). Fading and noise also disturbs the transmission.

Figure 2:
FIG. 2 depicts a TDM signal on a TDM channel.

The radio transmission system (10) is time sharing with separate time slots 1 to j in accordance with FIG. 2 ($T_o$ indicates time). A signal sequence (SS) includes a synchronizing sequence (SO) and a data sequence (DO) within each time slot "f". The signal sequence (SS) contains binary signals encoded, for instance, under a quadrature phase shift keying (QPSK) format.

Figure 3:
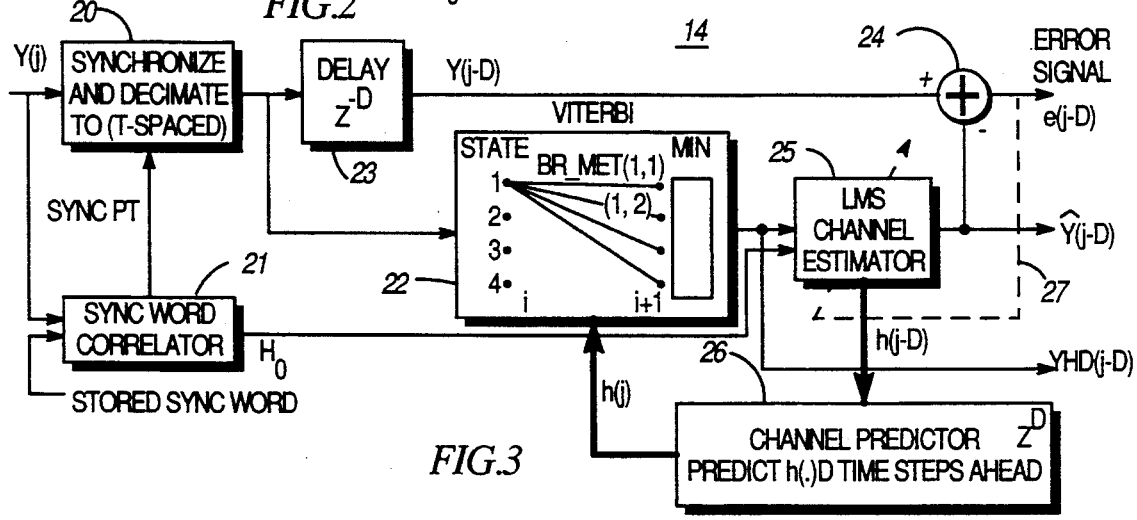
FIG. 3 comprises a block diagram of an adaptive maximum likelihood sequence estimator in accordance with the invention.

FIG. 3 is a block diagram of an adaptive maximum likelihood sequence estimator (AMLSE) (14) in accordance with one embodiment of the invention. Within the AMLSE (14) the synchronization (training) sequence (which includes the SO field and some symbols on either side of this field due to timing uncertainty) of a received signal y(j) is correlated with a stored copy of the synchronization word within a synch word correlator (21) (101, FIG. 8). This is done to provide a correlated output sequence, an initial channel estimate $h_o$, and a detected (synch point). The detected synchronization point is used within a decimator (20) to decimate the oversampled received signal y(j) to an information bandwidth consistent with the transmitted signal.

The viterbi decoder (22), processing the decimated signal, may by functionally equivalent to the viterbi equalizer described in the aforesaid article by F. R. Magee, Jr. and J. G. Proakis. The viterbi decoder (22) (102, FIG. 8) receives the decimated signal and delivers the estimated symbols yHD(j-D), which are estimated in a known manner with the delay of D sampling steps, to a least mean square (LMS) channel estimator (25). The LMS channel estimator (25) receives the estimated signals yHD(j-D) and filters them with a filter representing the current estimate of the channel impulse response in order to regenerate or estimate the channel impaired signal (y(j-D)). An error signal e(j-D) is generated based on the difference (24) between the decimated signal (y(j-D)) and the estimated received signal (y(j-D)). The error signal (e(j-D) generated by the difference is returned (dotted line 27) to the LMS channel estimator (25) and is used to update a current channel impulse response estimate (channel estimate).

Upon determination of a current channel estimate (h(j-D)) (based either upon an initial channel estimate ($h_o$) or upon an update through use of feedback error (e(j-D)) a channel prediction estimate (h(j)) is determined within a channel predictor (26). The channel prediction estimate (h(j)) is determined based upon changes in the current channel estimate over previous values and upon trends in the current channel estimate.

Performance of the AMLSE (14) is optimized when the decimated signal of the signal data y(j) are sampled near their maximum signal to noise ratio (SNR) and when the current channel estimate is a close reflection of actual channel conditions. The accuracy of the current channel estimate is closely related to a selected synchronization point.

The selection of a synchronization point, on the other hand, is complicated by delay spread of the sampled signal (y(j)). Delay spread, under one embodiment of the invention, is accommodated through use of a number of delay spread sensitive filters (e.g., delay spread detection (DSD) filters) and selection of the delay spread sensitive filter providing the largest filter peak. A set of synchronization point location (SPL) filter coefficients are selected based upon the identity of the selected DSD filter. Application of the SPL filter coefficients to the correlated output provides a synchronization point and initial channel estimate that optimizes AMLSE performance within a varying delay spread environment provided by the sampled signal (y(j)).

Figure 4:
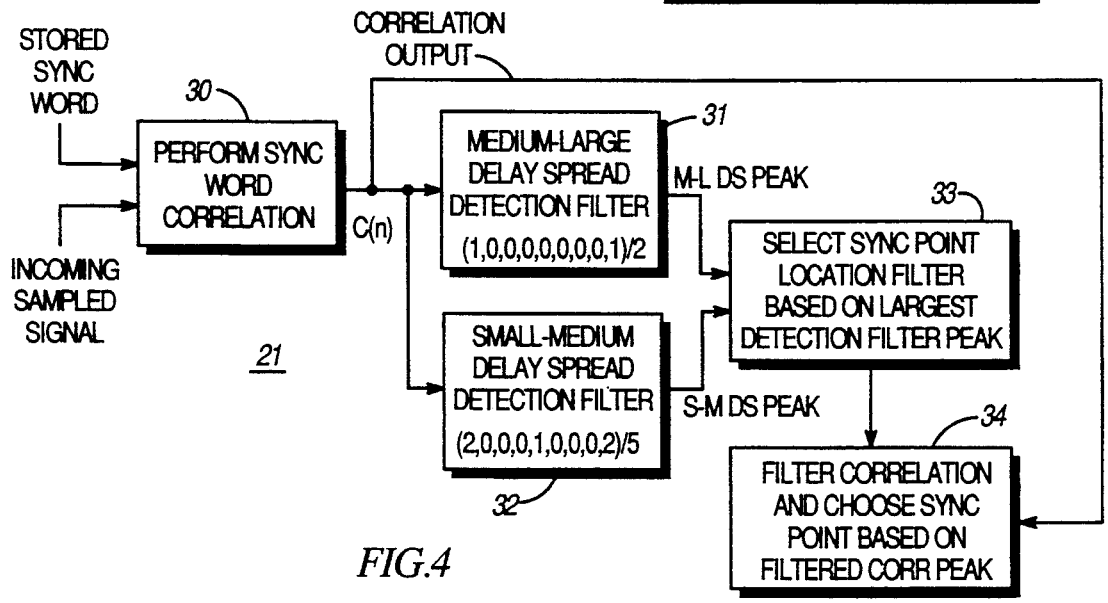
FIG. 4 comprises a block diagram of a synchronization word correlator in accordance with the invention.

By way of example, FIG. 4 is a block diagram of a sync word correlator (21), in accordance with one embodiment of the invention, using two DSD filters and assuming a sampling rate ($T_s$) of 8 samples per symbol interval (T). Of the two DSD filters a first DSD filter (31) has indicated filter values ((1, 0, 0, 0, 0, 0, 0, 0, 1)/2) for a medium, to large, delay spread (for other than flat fading). A second DSD filter (32) has indicated filter values ((2, 0, 0, 0, 1, 0, 0, 0, 2)/5) for zero to medium delay spread (for flat fading). As above described where the first DSD filter provides the largest DSD detection filter peak, the first DSD filter (31) is selected and where the second DSD filter (32) provides the largest DSD detection filter peak, the second DSD filter (32) is selected. Coefficients for the SPL filter (33) where the first DSD filter (31) is selected are as follows: (1, 0, 0, 0, 0, 0, 0, 0, 1). Coefficients for the SPL filter (33) where the second DSD filter is selected is as follows: (32, 16, 4, 0, 0, 0, 4, 16, 32).

Within the sync word correlator (21) a sampled data synchronization field (which includes the SO field and some symbols on either side of this field due to timing uncertainty) is cross-correlated with a stored synchronization word to provide a correlated output (c(n)). The correlated output (c(n)) is filtered using the medium-large DSD filter (31) and the small-medium DSD (32) (104, FIG. 8) filter. The magnitude of the outputs of each filter (the delay spread correlation peaks) are then compared. Based upon the identify of the largest delay spread correlation peak a set of coefficients for the SPL filter (33) (105, FIG. 8) are selected. The selected coefficients are then applied to the correlated output (c(n)) to provide a synchronization point and initial channel response (34) based on the location of the peak value of the filter output (sync point). The cross correlation complex value at the sync point and the complex value $T/T_s$ samples, on either side of the sync point represent the initial channel impulse response T-spaced tap estimates.

Figure 5:
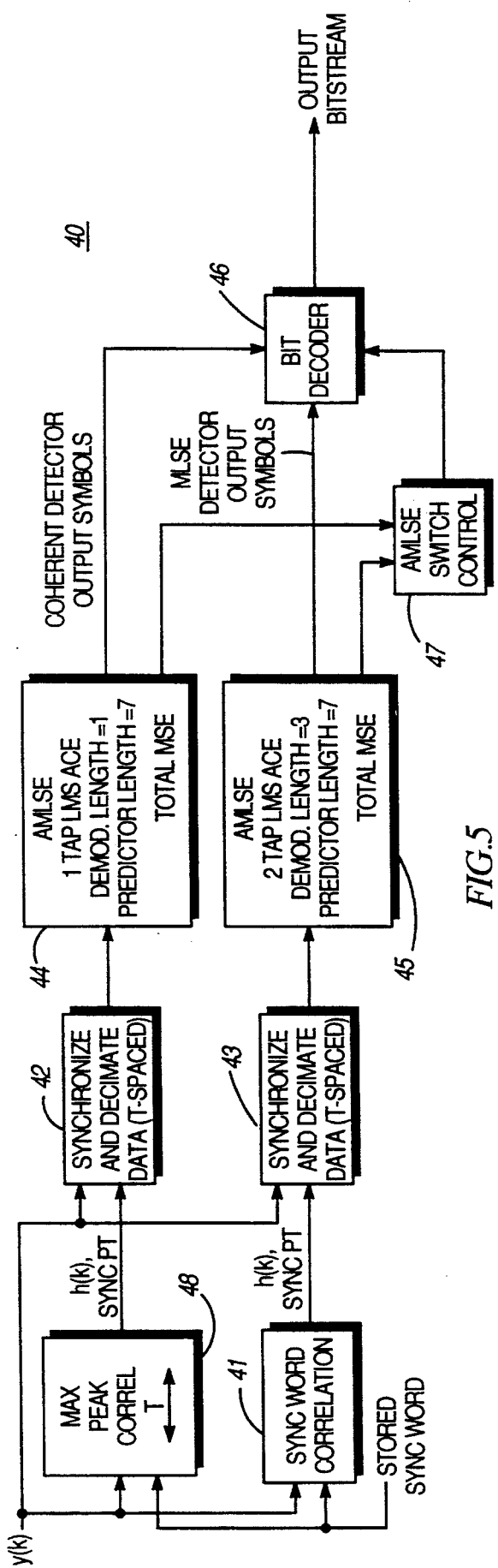
FIG. 5 comprises a block diagram of a parallel path maximum likelihood sequence estimator in accordance with the invention.

FIG. 5 is an example of an AMLSE using two parallel processing paths in accordance with another embodiment of the invention. The first processing path (41, 43, and 45) is functionally equivalent to the above described AMLSE (14, FIGS. 3 and 4) with block 41 corresponding to block 21, block 43 corresponding to block 20 and block 45 corresponding to blocks 22, 23, 24, 25, and 26. Within the second processing path (48, 42, and 44), block 42 is functionally equivalent to block 20 and block 44 corresponds to blocks 22, 23, 24, 25, and 26.

Figure 6:
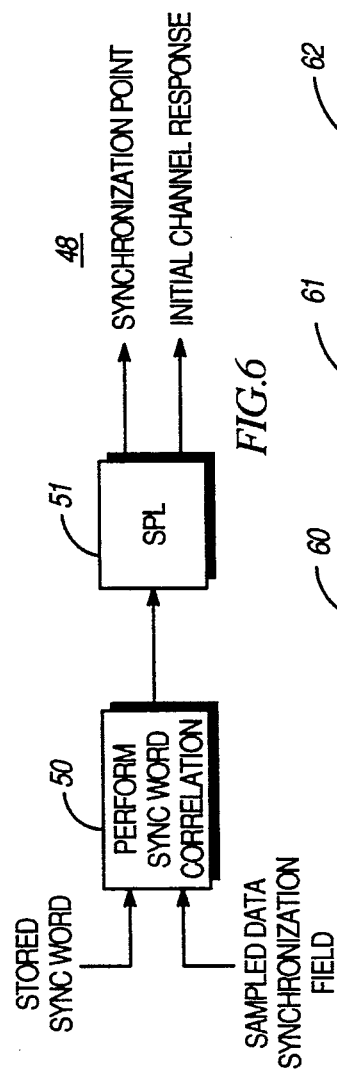
FIG. 6 is a block diagram of a max peak correlator in accordance with one embodiment of the invention.

In the second processing path (48, 42, and 44) the synch word correlator (21) is replaced with a max peak correlator (48). Contained within the max peak correlator (48) is a sync word correlator (50) (FIG. 6) and an alternate type of delay spread sensitive filter (SPL filter (51)). The filter coefficients of the SPL filter (48) have been selected (with tap values of (1, 0, 0, 0, 0, 0, 0, 0, 0)) to provide a maximum output upon conditions of flat delay.

In operation the max peak correlator (48) correlates the sampled data synchronization field with the stored synchronization word to provide a correlated output. The correlated output (103, FIG. 8) is then convolved with the SPL filter (51) to provide a synchronization point and an initial channel response (106, FIG. 8). The synchronization point is then used as described above to decimate the data synchronization field. The decimated data synchronization field is then subjected to maximum likelihood decoding as described above using the initial channel response (106, FIG. 8).

Under condition of flat fading it has been determined that an SPL filter (51) used in conjunction with a sync word correlator (50) provide superior results. When the SPL filter (51) is used in the form of a second processing path with the above described AMLSE (14) the combination further improves overall bit error rate (BER) within a communication system.

The outputs of the two signaling paths (FIG. 5) are supplied to a bit decoder (46) and an AMLSE switch control (47). The AMLSE switch control (47) compares mean square error estimates of each signal path and selects the path providing the least error. Upon selection of the signal path the AMLSE switch control (47) activates the bit decoder (46) to decode the signal from the path providing the least error (108, FIG. 8).

Figure 7:
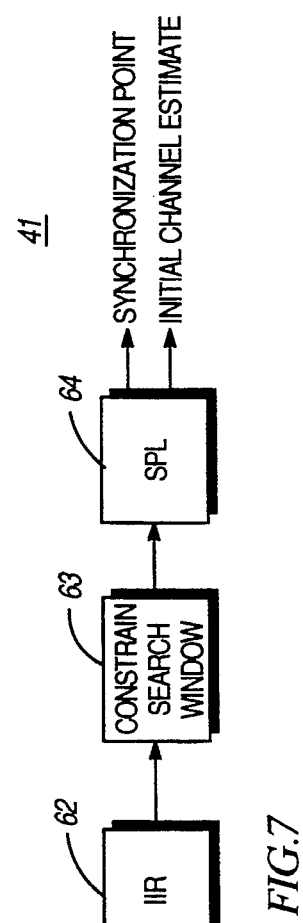
FIG. 7 comprises a block diagram of a sync word correlator using a constrained window.

In another embodiment of the invention a constrained search window (63) (FIG. 7) is used within the sync word correlator (41) to further improve the performance of the AMLSE (40). Under such an embodiment a delay spread correlation peak is selected by repeated filtering and a constrained window defined by a range ahead of and after a synchronization point. The range ahead of the initial synchronization point is selected to have an integral number of sample intervals (e.g., one sample interval). The range after the initial synchronization point is selected as having a time value commensurate with the duration of the channel impulse response due to the expected worst case delay spread and relative to the initial synchronization point (Given the delay spread models defined by the EIA/TIA TR45.3 committee for the U.S. TDMA digital cellular system, the range would be from the initial synchronization point to a point occurring T/2 seconds later, where T is the U.S. TDMA symbol interval).

The delay spread correlation peak is determined by DSD filtering (61) the correlated output sequence of the sync word correlator (60) with a DSD filter value (1, 1, 1, 1, 1, 1, 1, 1) designed to provide a general location of a synchronization point. The location or initial synchronization point indicated by the peak output of the DSD filter (61) is then averaged with previous initial synchronization points, corresponding to previous time slots, using an infinite impulse response (IIR) filter (62) for more precise determination of the synchronization point.

Following determination of a constrained window (63) a signal within the constrained window is subject to a synchronization point location filter (e.g., with tap values of (32, 16, 4, 0, 0, 0, 4, 16, 32)) to define a synchronization point and initial channel response through the second signal path. A maximum likelihood sequence estimation hypothesis is then determined as described above using the calculated synchronization point and initial channel response values. Determination of the hypothesis with the lowest BER is as above wherein the AMLSE switch control (47) selects the hypothesis with the lowest level of mean square error.

In another embodiment of the invention the constrained search window and more precisely determined synchronization point is used under a previous embodiment as an input to DSD filters (31 and 32), and SPL filter (33) within the second maximum likelihood sequence estimator signal processing path. Under such an embodiment the first maximum likelihood sequence estimator signal processing path (through use of the max peak correlator (48)) provides improved BER performance for flat fading. The second maximum likelihood sequence estimator signal processing path provides improved BER performance for other than flat fading.

The many features and advantages of this invention are apparent from the detailed specification and thus it is intended by the appended claims to cover all such features and advantages of the system which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

It is, of course, to be understood that the present invention is, by no means, limited to the specific showing in the drawing, but also comprises any modification within the scope of the appended claims.

We claim:

1. An apparatus for maximum likelihood sequence estimating comprising: a first maximum likelihood sequence estimator for flat fading; an at least second maximum likelihood sequence estimator for other than flat fading; means for selecting one of the first and second maximum likelihood sequence estimators with a least magnitude mean square error.

2. The apparatus as in claim 1 wherein the first maximum likelihood sequence estimator further comprises a synchronization point location filter with filter coefficients for flat fading.

3. The apparatus as in claim 1 wherein the at least second maximum likelihood sequence estimator further comprises delay spread detection filters.

4. The apparatus as in claim 3 wherein the at least second maximum likelihood sequence estimator further comprises a synchronization point location filter.

5. The apparatus as in claim 3 wherein the coefficients of the synchronization point location filter are determined based upon an output of the delay spread detection filters.

6. The apparatus as in claim 1 wherein the first and at least second maximum likelihood sequence estimators each comprises a viterbi decoder.

7. A method of providing synchronization and an initial channel estimate to a maximum likelihood sequence estimator, such method comprising the steps of: correlating a sampled data synchronization field of an incoming sampled signal with a stored synchronization word to produce a correlated output; filtering the correlated output with a plurality of delay spread sensitive filters to produce a plurality of outputs, respectively; selecting a set of synchronization point location filter coefficients based, at least in part, upon a relative magnitude of the outputs of the plurality of delay spread sensitive filters; and determining a synchronization point and the initial channel estimate based, at least in part, upon filtering the correlated output with the selected set of synchronization point location filter coefficients.

8. The method as in claim 7 wherein the step of filtering the correlated output with the plurality of delay spread sensitive filters further comprises the step of filtering using delay spread detection filters.

9. The method as in claim 8 wherein the step of filtering using delay spread sensitive filters further comprises the step of filtering using synchronization point location filters.

10. The method as in claim 8 wherein the step of selecting the set of synchronization point location filter coefficients is based, at least in part, upon a relative magnitude of the outputs of the plurality of delay spread sensitive filters further includes the step of determining an output of the plurality of delay spread sensitive filters having the largest relative magnitude.

11. The method as in claim 10 wherein the step of selecting the set of synchronization point location filter coefficients further comprises the step of selecting a set of coefficients based upon an identity of the delay spread sensitive filter having the largest relative magnitude.

12. A method of providing an initial channel estimate to a maximum likelihood sequence estimator, such method comprising the steps of: correlating a sampled data synchronization field of an incoming sampled signal with a stored synchronization word producing a correlated output; filtering the correlated output using a first and at least second delay spread detection filters producing a first and at least second detection peaks; selecting a set of synchronization point location filter coefficients based, at least in part, upon the first and at least second detection peaks of the first and at least second delay spread detection filters; determining a synchronization point and initial channel estimate based, at least in part, upon the correlated output with the selected set of synchronization point location filter coefficients.

13. A method of providing an initial channel estimate to a maximum likelihood sequence estimator, such method comprising the steps of: correlating a sampled data synchronization field of an incoming sampled signal with a stored synchronization word to produce a correlated output; filtering the correlated output using a first and at least second delay spread detection filters to produce a first and at least second detection peaks, respectively; selecting a set of synchronization point location filter coefficients based, at least in part, upon a magnitude of the first and at least second detection peaks; determining the initial channel estimate based, at least in part, upon filtering the correlated output with the selected set of synchronization point location filter coefficients.

14. A method of providing synchronization to a maximum likelihood sequence estimator, such method comprising the steps of: correlating a sampled data synchronization field of an incoming sampled signal with a stored synchronization word to produce a correlated output; filtering the correlated output using a first and at least second delay spread detection filters to produce a first and at least second detection peaks, respectively; selecting a set of synchronization point location filter coefficients based, at least in part, upon a magnitude of the first and at least second detection peaks; determining a synchronization point based, at least in part, upon filtering the correlated output with the selected set of synchronization point location filter coefficients.

15. A method of providing synchronization and an initial channel estimate to a maximum likelihood sequence estimator, such method comprising the steps of: correlating a sampled data synchronization field of an incoming sampled signal with a stored synchronization word to produce a correlated output; filtering the correlated output with a plurality of delay spread detection filters to produce a plurality of outputs, respectively; selecting a set of synchronization point location filter coefficients based, at least in part, upon relative magnitude of the outputs of the plurality of delay spread detection filters; and determining a synchronization point based, at least in part, upon filtering the correlated output with the selected set of synchronization point location filter coefficients.

16. A method of providing synchronization and an initial channel estimate to a maximum likelihood sequence estimator, such method comprising the steps of: correlating a sampled data synchronization field of an incoming sampled signal with a stored synchronization word to produce a correlated output; filtering the correlated output with a plurality of delay spread sensitive filters to produce a plurality of outputs, respectively; selecting a set of synchronization point location filter based, at least in part, upon relative magnitude of the outputs of the plurality of delay spread sensitive filters; and determining a synchronization point based, at least in part, upon filtering the correlated output with the selected set of synchronization point location filter coefficients.

17. A method of maximum likelihood decoding comprising the steps of: determining a first synchronization point for a data sequence within a sampled data synchronization field of a sampled data field and an initial channel estimate by cross correlating a stored synchronization word with the sampled data synchronization field of the sampled data field; decimating the data sequence with respect to the first synchronization point; determining a first most likely transmitted data sequence by maximum likelihood sequence estimation to produce a first hypothesis and total error of the first hypothesis; determining a correlated output sequence by cross-correlating the stored synchronization word with the sample data field; determining a first delay spread correlation peak by applying a first delay spread filter; determining a second delay spread correlation peak using a second delay spread filter; selecting a set of synchronization point location filter coefficients based, at least in part, upon the largest one of the first delay spread correlation peak and second delay spread correlation peak; convolving the set of synchronization point location filter coefficients with the correlated output sequence to produce a second synchronization point and a second initial channel estimate; decimating the data sequence with respect to the second synchronization point; determining a second most likely transmitted data sequence by maximum likelihood sequence estimation to produce a second hypothesis and total error of the second hypothesis; and selecting the hypothesis, of the first and second hypothesis, with the smallest total error.

18. A method of maximum likelihood decoding comprising the steps of: determining a correlated output sequence by cross-correlating a stored synchronization word with a sampled data synchronization field; convolving a first set of synchronization point location filter coefficients with the correlated output sequence to produce a first synchronization point and a first initial channel estimate; decimating a transmitted data sequence with respect to the first synchronization point; determining a first most likely transmitted data sequence by maximum likelihood sequence estimation decoding to produce a first hypothesis and total error of the first hypothesis; determining a first delay spread correlation peak by applying a first delay spread detection filter to the correlated output sequence; determining a second delay spread correlation peak by applying a second delay spread detection filter to the correlated output sequence; selecting a set of synchronization point location filter coefficients based upon a largest of the first delay spread correlation peak and second delay spread correlation peak; convolving the set of synchronization point location filter coefficients with the correlated output sequence to produce a second synchronization peak and a second initial channel estimate; decimating a transmitted data sequence with respect to the second synchronization point; determining a second most likely transmitted data sequence by maximum likelihood decoding to produce a second hypothesis and total error of the second hypothesis; and selecting the hypothesis with the smallest total error.

19. A method of maximum likelihood decoding comprising the steps of: determining a correlated output sequence by cross-correlating a stored synchronization word with a sampled data synchronization field; convolving a first set of synchronization point location filter coefficients with the correlated output sequence to produce a first synchronization point and a first initial channel estimate; decimating a transmitted data sequence with respect to the first synchronization point; determining a first most likely transmitted data sequence by maximum likelihood sequence estimation decoding to produce a first hypothesis and total error of the first hypothesis; determining a first delay spread correlation peak and corresponding initial synchronization point by applying a first delay spread filter; determining a filtered initial synchronization point using a one pole infinite impulse response filter on the initial synchronization point and previous initial synchronization points corresponding to previous time slots; selecting a constrained search window using as limits one sample interval before the initial synchronization point and a point after the initial synchronization point which will include a duration of the channel impulse response due to expected worst case delay spread and relative to the initial synchronization point; convolving a set of synchronization point location filter coefficients with the correlated output sequence over the constrained search window to produce a second synchronization point and a second initial based on the peak value of the output; decimating a transmitted data sequence with respect to the second synchronization point; determining a second most likely transmitted data sequence by maximum likelihood decoding to produce a second hypothesis and total error of the second hypothesis; and selecting the hypothesis with the smallest total error.

20. A method of maximum likelihood decoding comprising the steps of: determining a correlated output sequence by cross-correlating a stored synchronization word with a sampled data synchronization field; convolving a first set of synchronization point location filter coefficients with the correlated output sequence to produce a first synchronization point and a first initial channel estimate; decimating a transmitted data sequence with respect to the first synchronization point; determining a first most likely transmitted data sequence by maximum likelihood sequence estimation decoding to produce a first hypothesis and total error of the first hypothesis; determining a first delay spread correlation peak and corresponding initial synchronization point by applying a first delay spread filter; determining a filtered initial synchronization point using a one pole infinite impulse response filter on the initial synchronization point and previous initial synchronization points corresponding to previous time slots; selecting a constrained search window using as limits one sample interval before the initial synchronization point and a point after the initial synchronization point which will include a duration of the channel impulse response due to expected worst case delay spread and relative to the initial synchronization point; determining a first delay spread correlation peak by applying a first delay spread detection filter to the correlation output sequence over the constrained search window; determining a second delay spread correlation peak using a second delay spread detection filter over the constrained search window; comparing the first delay spread correlation peak and second delay spread correlation peak and, based upon the largest delay spread correlation peak, selecting a set of synchronization point location filter coefficients; convolving the selected synchronization point location filter coefficients with the correlated output sequence over the constrained search window to produce a second synchronization point and a second initial channel estimate based on the peak value of the output; decimating the transmitted data sequence with respect to the second synchronization point; determining a second most likely transmitted data sequence by maximum likelihood decoding to produce a second hypothesis and total error of the second hypothesis; and selecting the hypothesis with the smallest total error.

* * * * *